United States Patent
Smoliar

[19]

[11] Patent Number: 5,985,105
[45] Date of Patent: Nov. 16, 1999

[54] METHOD OF SPUTTERING PROTECTIVE OVERCOATS WITH IMPROVED CORROSION RESISTANCE

[75] Inventor: Laura Smoliar, Palo Alto, Calif.

[73] Assignee: Seagate Technology, Inc., Scotts Valley, Calif.

[21] Appl. No.: 09/115,249

[22] Filed: Jul. 14, 1998

Related U.S. Application Data

[60] Provisional application No. 60/065,167, Dec. 4, 1997.

[51] Int. Cl.$^6$ .................................................. C23C 14/32
[52] U.S. Cl. .................... 204/192.2; 204/192.12; 204/192.15; 204/298.23; 204/298.27
[58] Field of Search ................ 204/192.12, 192.13, 204/192.15, 192.2, 298.23, 298.27, 298.28

[56] References Cited

U.S. PATENT DOCUMENTS

| | | | |
|---|---|---|---|
| 5,087,340 | 2/1992 | Onagi et al. | 204/192.2 |
| 5,328,583 | 7/1994 | Kameyama et al. | 204/298.28 |
| 5,482,604 | 1/1996 | Ahonen . | |
| 5,603,814 | 2/1997 | Tsutsumi et al. | 204/192.2 |
| 5,658,438 | 8/1997 | Givens et al. . | |
| 5,718,811 | 2/1998 | Chen et al. | 204/192.2 |
| 5,895,712 | 4/1999 | Chen et al. | 204/192.2 |

*Primary Examiner*—Nam Nguyen
*Assistant Examiner*—Gregg Cantelmo
*Attorney, Agent, or Firm*—McDermott, Will & Emery

[57] ABSTRACT

A protective overcoat with improved corrosion resistance is sputter deposited on a magnetic thin film medium to effectively cover and seal the side walls of high aspect ratio roughness features. During sputter deposition, the disk is rotated about a y axis of an x-y plane and spun in the x-y plane while sputtering particles are impinged in a direction substantially along a z-axis perpendicular to the x-y plane. Embodiments include simultaneous or intermittent disk rotation and spinning. The sputtering technique is applicable to depositing corrosion resistance protective overcoats on thin film magnetic recording media and magneto-optical media.

20 Claims, 4 Drawing Sheets

METHOD OF SPUTTERING PROTECTIVE OVERCOATS WITH IMPROVED CORROSION RESISTANCE

RELATED APPLICATIONS

This application claims priority from Provisional Application Ser. No. 60/065167, filed on Dec. 4, 1997, entitled "Protective Overcoat Sputtering Method to Improve Corrosion Resistance of Thin Film Media", the entire disclosure of which is incorporated by reference herein.

TECHNICAL FIELD

The present invention relates to thin film magnetic disks with protective overcoats. The invention has particular applicability in manufacturing magnetic recording media and magneto-optical media comprising a textured glass or glass-ceramic substrate.

BACKGROUND ART

Thin film magnetic recording disks and disk drives are conventionally employed for storing large amounts of data in magnetizable form. In operation, a typical contact start/stop (CSS) method commences when a data transducing head begins to slide against the surface of the disk as the disk begins to rotate. Upon reaching a predetermined high rotational speed, the head floats in air at a predetermined distance from the surface of the disk where it is maintained during reading and recording operations. Upon terminating operation of the disk drive, the head again begins to slide against the surface of the disk and eventually stops in contact with and pressing against the disk. Each time the head and disk assembly is driven the sliding surface of the head repeats the cyclic operation consisting of stopping, sliding against the surface of the disk, floating in air, sliding against the surface ot the disk and stopping For optimum consistency and predictability, it is necessary to maintain each transducer head as close to its associated recording surface as possible., i.e., to minimize the flying height of the head. Accordingly, a smooth recording surface is preferred, as well as a smooth opposing surface of the associated transducer head. However, if the head surface and the recording surface are too flat, the precision match of these surfaces gives rise to excessive stiction and friction during the start up and stopping phases, thereby causing wear to the head and recording surfaces, eventually leading to what is referred to as a "head crash." Thus, there are competing goals of reduced head/disk friction and minimum transducer flying height.

Conventional practices for addressing these apparent competing objectives involve providing a magnetic disk with a roughened recording surface to reduce the head/disk friction by techniques generally referred to as "texturing." Conventional texturing techniques involve mechanical polishing or laser texturing opposing surfaces of a disk substrate to provide a texture thereon prior to subsequent deposition of layers, such as an underlayer, a magnetic layer, a protective overcoat, and a lubricant topcoat, wherein the textured substrate surfaces are intended to be substantially replicated in the subsequently deposited layers. The surface of an underlayer can also be textured, and the texture substantially replicated in subsequently deposited layers.

A typical longitudinal recording medium is depicted in FIG. 1 and comprises a substrate 10, typically an aluminum (Al)-alloy, such as an aluminum-magnesium (Al—Mg) alloy, plated with a layer of amorphous nickel-phosphorus (NiP). Alternative substrates include glass, ceramic, glass-ceramic materials and graphite. Substrate 10 typically contains sequentially deposited on each side thereof a chromium (Cr) or (Cr-alloy underlayer 11, 11', a cobalt (Co)-base alloy magnetic layer 12, 12', a protective overcoat 13, 13', typically containing carbon, and a lubricant topcoat 14, 14', Cr underlayer 11, 11' can be applied as a composite comprising a plurality of sub-underlayers 11A, 11A'. Cr underlayer 11, 11', Co-base alloy magnetic layer 12, 12' and protective overcoat 13, 13', typically containing carbon, are usually deposited by sputtering techniques performed in an apparatus containing sequential deposition chambers. A conventional Al-alloy substrate is provided with a NiP plating, primarily to increase the hardness of the Al substrate, serving as a suitable surface to provide a texture, which is substantially reproduced on the disk surface.

In accordance with conventional practices, a lubricant topcoat is uniformly applied over the protective overcoat to prevent wear between the disk and head interface during drive operation. Excessive wear of the protective overcoat increases friction between the head and disk, thereby causing catastrophic drive failure. Excess lubricant at the head-disk interface causes high stiction between the head and disk. If stiction is excessive, the drive cannot start and catastrophic failure occurs. Accordingly, the lubricant thickness must be optimized for stiction and friction.

A conventional material employed for the lubricant topcoat comprises a perfluoro polyether (PFPE) which consists essentially of carbon, fluorine and oxygen atoms. The lubricant is usually dissolved in an organic solvent applied and bonded to the magnetic recording medium by techniques such as thermal treatment, ultraviolet (UV) irradiation and soaking. A significant factor in the performance of a lubricant topcoat is the bonded lube ratio which is the ratio of the amount of lubricant bonded directly to the magnetic recording medium to the amount of lubricant bonded to itself or the mobile lubricant. Desirably, the bonded lube ratio should be high to realize a meaningful improvement in stiction and wear performance of the resulting magnetic recording medium.

There are various types of carbon, some of which have been employed for a protective overcoat in manufacturing a magnetic recording medium. Such types of carbon include hydrogenated carbon, graphitic carbon or graphite and carbon nitride. These types of carbon are well known in the art and, hence, not set forth herein in great detail.

The drive for high areal recording density and, consequently, reduced flying heights, challenges the limitations of conventional practices in manufacturing a magnetic recording medium containing a carbon protective overcoat. For example, a suitable protective overcoat must be capable of preventing corrosion of the underlying magnetic layer, which is an electrochemical phenomenon dependent upon such factors as environmental conditions, e.g., humidity and temperature. In addition, a suitable protective overcoat must prevent migration of ions from underlying layers into the lubricant topcoat and to the external surface of the magnetic recording medium. Thus, the protective overcoat must seal the magnetic layer. Furthermore, in media comprising a glass or glass-ceramic substrate, the protective overcoat must also seal the underlying substrate from the outside environment. Such sealing is necessary, particularly in warm and humid conditions, characteristic of the running disk drive, which are conducive to corrosion of the magnetic recording layer. When a glass or glass-ceramic substrate is employed, sodium, lithium and/or potassium ions accelerate corrosion by diffusing to the top surface of the disk.

In order to prevent corrosion, conventional practices comprise sputter depositing a carbon-containing overcoat on magnetic recording media, or a silicon nitride or aluminum nitride overcoat on magneto-optical media. The protective overcoat is typically sputter deposited on the surface of the disk comprising the substrate and magnetic layer.

Conventional practices also comprise sputter depositing a plurality of protective overcoats and/or incorporating a corrosion resistant additive in the glass or glass-ceramic substrate, such as zinc, to provide adequate corrosion resistance. Such conventional techniques have not proved entirely satisfactory for insuring adequate corrosion resistance. Moreover, as the head disk interface decreases to less than one microinch, it is necessary to reduce the thickness of the protective overcoat below about 200 Å. It is, therefore, extremely difficult, if not impossible, to deposit a plurality of protective overcoats and satisfy the esculating requirements of increased areal recording density.

Ahonen, U.S. Pat. No. 5,482,604, discloses a sputter deposition technique for manufacturing a mirror, wherein the substrate is rotated to improve coating uniformity. Givens et al. U.S. Pat. No. 5,658,438, discloses a collimating sputter deposition technique for filling high aspect ratio openings in manufacturing semiconductor devices.

There exists a need for method of sputter depositing protective overcoat to provide superior corrosion resistance of magnetic thin film media, particularly with respect to the underlying magnetic layer, and to prevent migration of ions from underlying layers or the substrate itself. There also exists a need for a method of sputter depositing a protective overcoat on a magnetic thin film media having a thickness satisfying the imposing demands for high areal recording density and reduced head-disk interface.

DISCLOSURE OF THE INVENTION

An object of the present invention is a method of sputter depositing an effective protective overcoat on a magnetic thin film medium to provide corrosion resistance.

Another object of the present invention is a method of sputter depositing a protective overcoat on a magnetic thin film medium comprising laser textured protrusions with high aspect ratios.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a magnetic thin film medium, the method comprising: depositing a magnetic layer on a substrate disk having opposing major surfaces with a surface roughness comprising features with sidewalls, wherein the surface roughness is substantially reproduced on the magnetic layer; and sputter depositing a protective overcoat on the magnetic layer by: positioning the disk so that its major surfaces are substantially parallel to an x-y plane; impinging sputtering particles in a direction substantially along a z axis perpendicular to the x-y plane, rotating the disk about the y axis; and spinning the disk in the x-y plane.

Additional objects and advantages of the present invention will become readily apparent to those skilled in this art from the following detailed description, wherein the embodiments of the invention are shown and described simply by way of illustration ot the best mode contemplated for carrying out the invention. As will be realized, the invention is capable of other and different embodiments, and its several details are capable of modifications in various obvious respects, all without departing from the invention. Accordingly, the description is to be regarded as illustrative in nature and not as restrictive.

DESCRIPTION OF THE DRAWINGS

The present invention provides methodology for sputter depositing protective overcoats to impart high corrosion resistance to thin film magnetic media by effectively sealing the magnetic layer and underlying substrate from the outside environment. The present invention provides effective sealing of sidewalls of protrusions having high aspect ratios, such as protrusions formed by laser texturing a non-magnetic substrate to form a landing zone. The present invention is applicable to sputter depositing a carbon-containing protective overcoat in manufacturing magnetic recording media, as well as sputter depositing a silicon nitride or aluminum nitride protective overcoat in manufacturing magneto-optical media, including magnetic super resolution (MSR) media.

In order to adequately prevent corrosion, it is necessary to sputter deposit a protective overcoat to achieve complete surface coverage. Unfortunately, substrates inevitably exhibit inherent surface roughness. Moreover, conventional practices comprise laser texturing a substrate surface to form a landing zone comprising rough protrusions extending above the substrate surface. The inherent surface roughness and/or laser textured protrusions have high aspect ratios (height:width).

Figure 2:
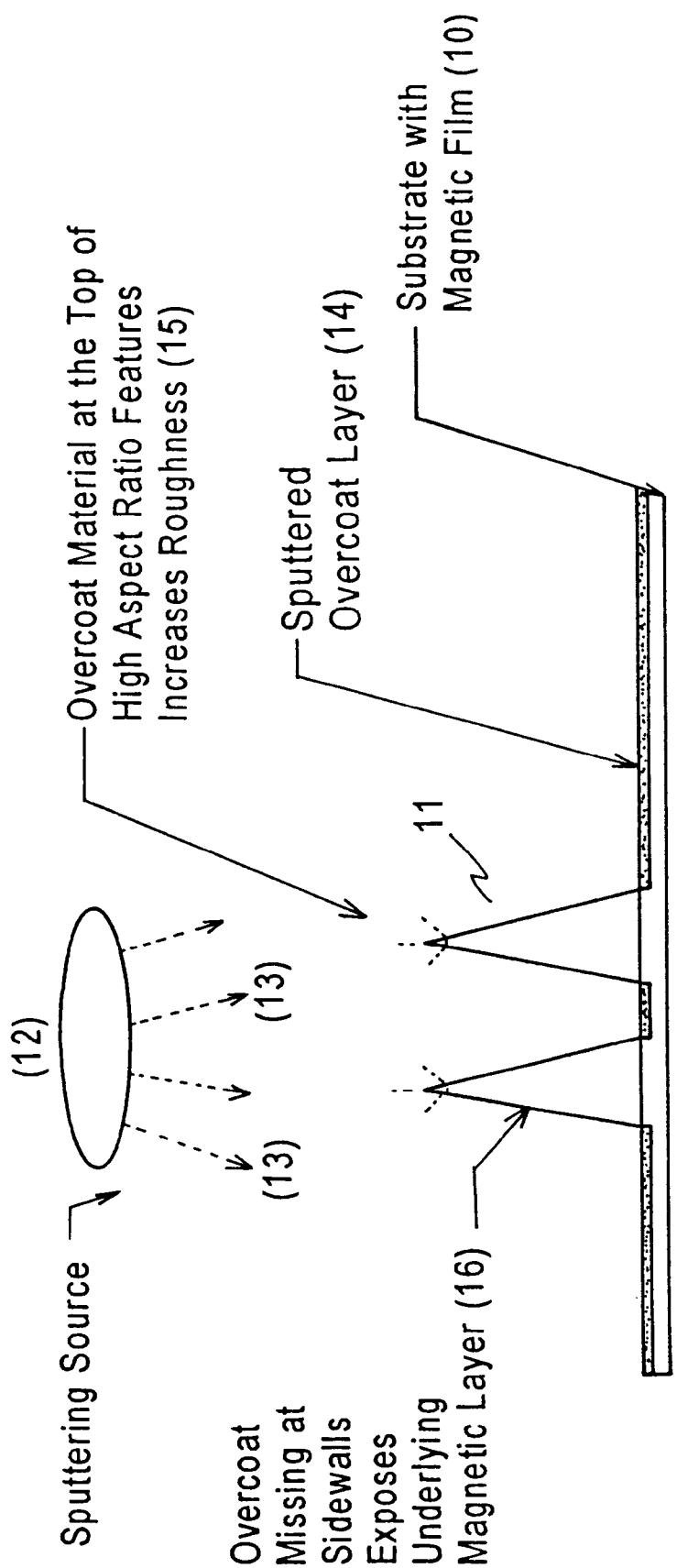
FIG. 2 schematically illustrates the shadowing phenomenon which occurs during conventional sputtering techniques.

After extensive experimentation and investigation, it was found that a shadowing effect occurs during conventional sputter techniques which prevents a deposited overcoat from completely covering or sealing the sidewalls of surface features, particularly sidewalls of surface features having a relatively high aspect ratio, e.g., an aspect ratio greater than about 3. The shadowing effect is schematically illustrated in FIG. 2 with respect to a substrate with magnetic film 10 having high aspect ratio features 11. During sputter deposition from sputter source 12. impinging sputtering particles 13 form a sputtered overcoat layer 14 on the magnetic film and adhere to the tips 15 of the high aspect ratio features 11. However, the protective overcoat material misses the sidewalls 16 of the high aspect ratio features 11, thereby inadequately covering or sealing the magnetic layer.

Experimentation was conducted to confirm the impact of the shadowing effect on corrosion. A magnetic recording medium was prepared employing a glass-ceramic substrate containing zinc for enhanced corrosion resistance. The full disk surface was laser textured and a magnetic cobalt alloy deposited thereon. A carbon-containing protective overcoat was sputter deposited on the magnetic layer while maintaining the substrate in a fixed position. Three such disks were prepared, along with three comparison disks wherein the substrate was not subjected to laser texturing. The disks were then exposed to a temperature of 50° C. and a relative humidity of 95% for four days.

Figure 3:
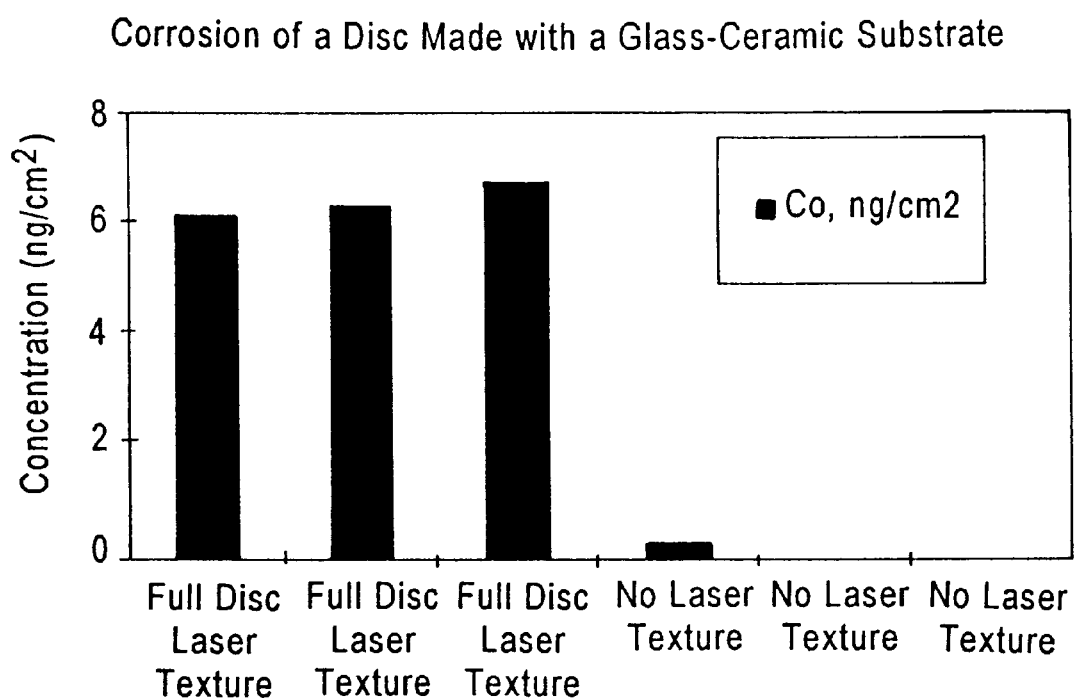
FIG. 3 is a graph showing corrosion results attributed to the shadowing effect.

The ion chromatography of material washed off from the disks showed enhanced cobalt levels of the laser textured disks. The results are reported in FIG. 3, confirming the negative impact of a texture and, hence, the shadowing effect, on corrosion. Atomic force microscope images taken of the laser textured area revealed that the laser protrusions or bumps on a glass-ceramic substrate are significantly rougher than laser textured protrusions on a metal layer. This difference may be due to glass-ceramic phase separation, which renders the shadowing effect particularly acute when employing glass-ceramic substrates.

In accordance with the present invention, a substrate with a magnetic layer thereon is strategically rotated and spun with respect to the direction of incident sputtering particles so that the impinging sputter particles effectively cover the sidewalls of rough surface features, including laser textured features, particularly features having high aspect ratios. Thus, the present invention enables complete sealing of the magnetic layer without incorporating additional corrosion resistant additives in the substrate employing a thin single protective overcoat, thereby maintaining a small distance between the head and the magnetic recording layer in the final disk drive product.

Figure 4:
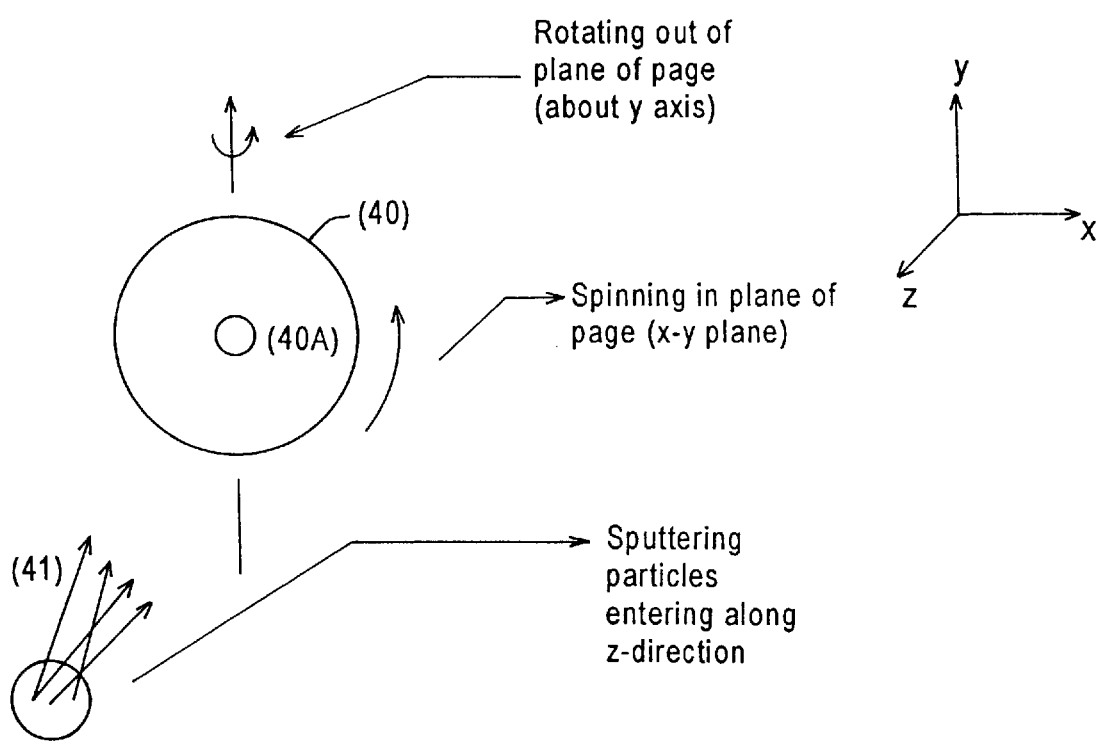
FIG. 4 schematically illustrates an embodiment of the present invention.

An embodiment of the present invention is illustrated in FIG. 4 and comprises positioning disk 40 having opposing major surfaces 40A such that the major surfaces 40A are substantially parallel to an x-y plane. Sputtering particles 41 are than directionally impinged in a direction substantially perpendicular to the x-y plane. During sputter deposition, disk 40 is rotated about the y axis and spun in the x-y plane. Embodiments of the present invention include simultaneously rotating and spinning disk 40 during sputter deposition. Other embodiments of the present invention include intermittently rotating and spinning disk 40 during sputter deposition. The sputtering particles can be directionally impinged in a conventional manner, as by employing a collimator or high density plasma sputtering techniques.

As the disk is rotated about the y axis the angle of incidence of the sputtering particles with respect to the plane of the major surfaces of 40A is changed, thereby effectively covering the sidewalls of high aspect ratio features on the disk surfaces. As the disk is spun in the x-y plane, the uniformity of the deposited overcoat is maximized. Particularly high corrosion resistant coatings are obtained by simultaneously rotating the disk about the y axis and spinning the disk in the x-y plane during sputter deposition.

The present invention enjoys utility in sputter depositing various types of protective overcoats, such as carbon-containing protective overcoats in manufacturing magnetic recording media. The present invention is also applicable to sputter depositing protective overcoats in manufacturing magneto-optical devices, as by sputter depositing silicon nitride or aluminum nitride protective overcoats. The present invention is particularly applicable in manufacturing magnetic thin film media having glass or glass-ceramic substrates, wherein ions in the glass accelerate corrosion. The present invention avoids the necessity of introducing a corrosion resistant additive in the substrate material and enables deposition of a single relatively thin protective overcoat, e.g., less than about 200 Å, while providing superior corrosion resistance. The sputter depositing technique of the present invention involving disk rotation about the y axis and spinning in the x-y plane while impinging sputtering particles in a direction substantially perpendicular to the x-y plane can be employed for depositing dielectric layers between metal layers in manufacturing MSR media to prevent mixing of metal layer constituents through diffusion.

The present invention is particularly applicable to magnetic thin film media having a mean surface roughness $R_a$ greater than about 10 Å, e.g., between about 10 Å to about 13 Å, and to magnetic thin film media having laser textured landing zones comprising protrusions with high aspect ratios, e.g., greater than about 3, including laser protrusions or bumps greater than about 100 Å, e.g., about 100 Å to about 200 Å.

Figure 1:
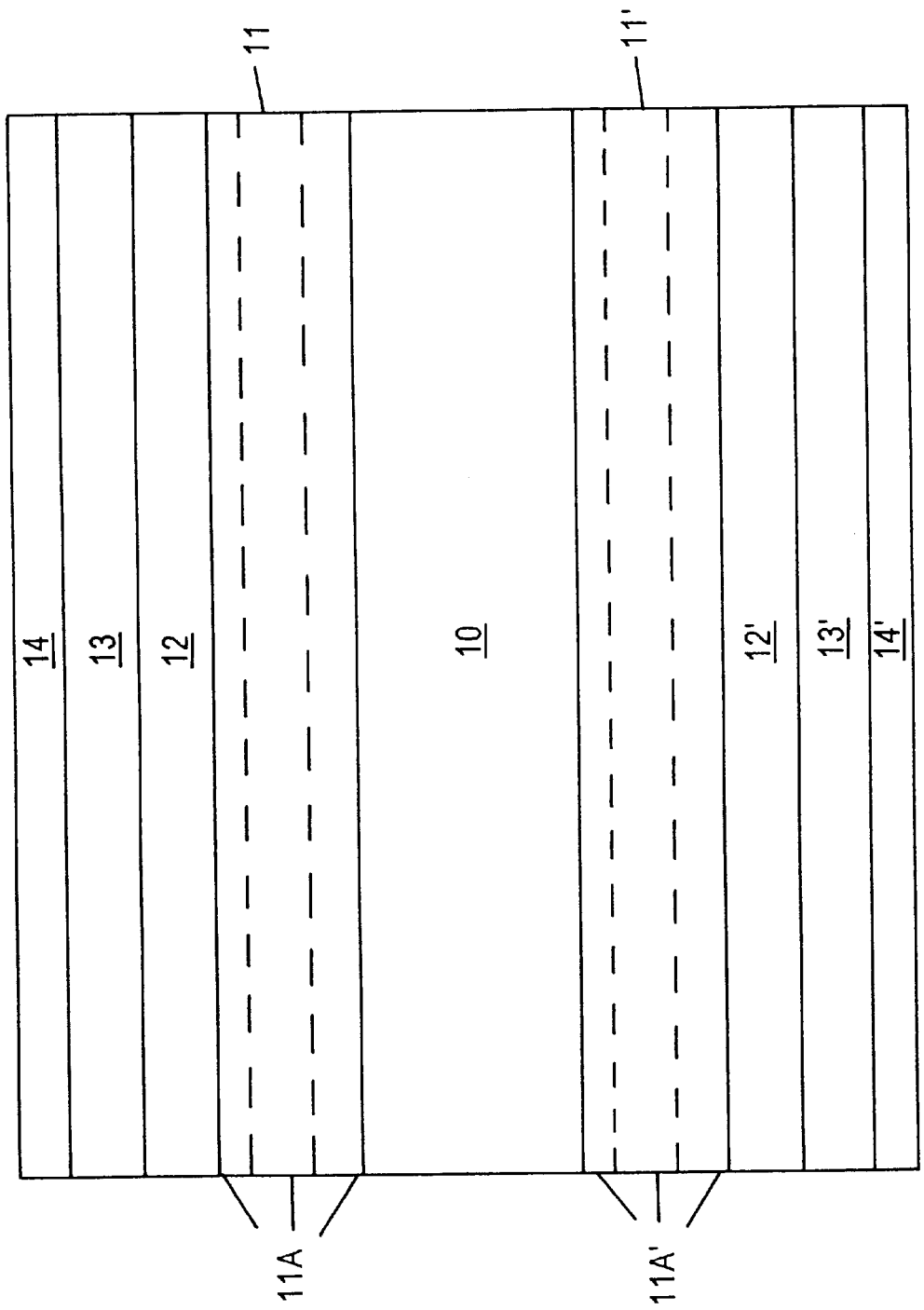
FIG. 1 schematically illustrates a conventional magnetic recording medium.

The present invention is applicable to the production of various types of magnetic thin film media, including a the magnetic recording medium illustrated in FIG. 1. The present invention is particularly useful in producing high areal recording density magnetic recording media requiring low flying heights.

Only the preferred embodiment ot the present invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a magnetic thin film medium, the method comprising:

depositing a magnetic layer on a substrate disk having opposing major surfaces with a surface roughness comprising features with sidewalls, wherein the surface roughness is substantially reproduced on the magnetic layer; and sputter depositing a protective overcoat on the magnetic layer by:

positioning the substrate disk so that the substrate disk's major surfaces are substantially parallel to an x-y plane;

impinging sputtering particles in a direction substantially along a z axis perpendicular to the x-y plane;

rotating the substrate disk on the y-axis of the x-y plane; and spinning the substrate disk in the x-y plane, wherein the protective overcoat is deposited on both of the substrate disk's manor surfaces.

2. The method according to claim 1, comprising laser texturing the substrate disk to form a plurality of protrusions.

3. The method according to claim 2, wherein the substrate disk comprises a glass or glass-ceramic material.

4. The method according to claim 3, wherein the protrusions have an aspect ratio greater than about 3.

5. The method according to claim 3, comprising laser texturing the substrate disk to form a landing zone, comprising laser protrusions, having a mean surface roughness $R_a$ greater than about 10 Å.

6. The method according to claim 5, wherein the laser protrusions have a height greater than about 100 Å.

7. The method according to claim 3, wherein:

the magnetic thin film medium comprises a magnetic recording medium; and the protective overcoat contains carbon.

8. The method according to claim 3, wherein:

the magnetic thin film medium comprises a magneto-optical medium; and the protective overcoat comprises silicon nitride or aluminum nitride.

9. The method according to claim 8, wherein the magnetic thin film medium comprises a magneto-optical medium and the method further comprises:

sputter depositing at least one dielectric layer on a metal layer by:

positioning the substrate disk so that the substrate disk's major surfaces are substantially parallel to an x-y plane;

impinging the sputtering particles in a direction substantially along a z axis perpendicular to the x-y plane;

rotating the substrate disk about the y-axis of the x-y plane; and spinning the substrate disk in the x-y plane.

10. The method according to claim 1, comprising sputter depositing a single protective overcoat.

11. The method according to claim 10, wherein:

the substrate disk comprises a glass or glass-ceramic materials without a corrosion resistance additive.

12. The method according to claim 1, comprising simultaneously spinning and rotating the substrate disk.

13. The method according to claim 1, comprising intermittently spinning and rotating the substrate disk.

14. The method according to claim 1, wherein the sputter deposited protective coating substantially completely covers the side walls of the protrusions.

15. A method of manufacturing a magnetic thin film medium, the method comprising:

depositing a magnetic layer on a substrate disk having a center and opposing major surfaces with a surface roughness comprising features with sidewalls, wherein the surface roughness is substantially reproduced on the magnetic layer; and sputter depositing a protective overcoat on the magnetic layer by:

spinning the substrate disk around the center of the substrate disk;

rotating the substrate disk about a diameter of the substrate disk; and impinging sputtering particles toward the major surfaces.

16. The method according to claim 15, comprising laser texturing the substrate disk to form a plurality of protrusions, wherein the substrate disk comprises a glass or glass-ceramic material.

17. The method according to claim 16, wherein:

the magnetic thin film comprises a magnetic recording medium; and the protective overcoat contains carbon.

18. The method according to claim 16, wherein:

the magnetic thin film comprises a magneto-optical medium; and the protective overcoat comprises silicon nitride or aluminum nitride.

19. The method according to claim 18, further comprising:

sputter depositing at least one dielectric layer on a metal layer by:

spinning the substrate disk about the center of the substrate disk;

rotating the substrate disk about a diameter of the substrate disk; and impinging the sputtering particles toward the major surfaces.

20. The method according to claim 15, comprising simultaneously spinning and rotating the substrate disk.

* * * * *